United States Patent
Brueck et al.

(10) Patent No.: US 12,204,249 B1
(45) Date of Patent: Jan. 21, 2025

(54) DUAL DIFFRACTION ORDER SPIN-ON-GLASS PHASE-GRATING BEAM-SPLITTER BASED OBLIQUE INCIDENCE NANOPATTERNING AND METHODS THEREOF

(71) Applicant: UNM RAINFOREST INNOVATIONS, Albuquerque, NM (US)

(72) Inventors: Steven R. J. Brueck, Albuquerque, NM (US); Alexander Neumann, Albuquerque, NM (US); Vineeth Sasidharan, Albuquerque, NM (US)

( * ) Notice: Subject to any disclaimer, the term of this patent is extended or adjusted under 35 U.S.C. 154(b) by 112 days.

(21) Appl. No.: 17/853,630

(22) Filed: Jun. 29, 2022

Related U.S. Application Data

(60) Provisional application No. 63/216,793, filed on Jun. 30, 2021.

(51) Int. Cl.
  *G03F 7/00* (2006.01)
  *G02B 7/00* (2021.01)
  *G02B 27/09* (2006.01)
  *G02B 27/10* (2006.01)

(52) U.S. Cl.
  CPC ......... *G03F 7/70158* (2013.01); *G02B 7/003* (2013.01); *G02B 27/0916* (2013.01); *G02B 27/0955* (2013.01); *G02B 27/1086* (2013.01)

(58) Field of Classification Search
  CPC . G03F 7/70158; G02B 7/003; G02B 27/0916; G02B 27/1086; G02B 27/0955
  See application file for complete search history.

(56) References Cited

U.S. PATENT DOCUMENTS

| | | | | |
|---|---|---|---|---|
| 5,715,039 A | * | 2/1998 | Fukuda | G03F 7/70316 355/53 |
| 2005/0175362 A1 | * | 8/2005 | Wilson | G01J 3/0289 356/328 |
| 2009/0068597 A1 | * | 3/2009 | Shiraishi | G03B 27/72 355/71 |
| 2010/0279233 A1 | * | 11/2010 | Kim | G03F 7/70408 430/324 |
| 2012/0092634 A1 | * | 4/2012 | Solak | G03F 7/70408 355/77 |

* cited by examiner

*Primary Examiner* — Peter B Kim
(74) *Attorney, Agent, or Firm* — MH2 Technology Law Group LLP

(57) ABSTRACT

A system for oblique incidence nanopatterning a sample using a grating beam-splitter is disclosed. The system also includes a grating beam-splitter on a tip-tilt adjustable mount. The system also includes a photoresist coated sample mounted on a tip-tilt-z adjustable mount. The system also includes an alignment system to allow adjustment of the tip-tilt adjustable mounts so that a surface of the grating beam-splitter and a surface of the photoresist coated sample are substantially parallel. The system also includes a laser operating at a wavelength suitable for exposure of the photoresist. The system also includes an optical system to deliver a laser beam at oblique incidence to the grating beam-splitter to expose the photoresist coated sample. The system also includes means to control an exposure dose of the laser beam. A system using two grating beam-splitters to provide increased alignment tolerance is also disclosed.

20 Claims, 10 Drawing Sheets

DUAL DIFFRACTION ORDER SPIN-ON-GLASS PHASE-GRATING BEAM-SPLITTER BASED OBLIQUE INCIDENCE NANOPATTERNING AND METHODS THEREOF

CROSS REFERENCE TO RELATED APPLICATIONS

This application claims priority to U.S. 63/216,793, filed on Jun. 30, 2021, which is hereby incorporated by reference in its entirety.

STATEMENT OF GOVERNMENT INTEREST

This invention was made with government support under EEC1160494 awarded by the National Science Foundation. The government has certain rights in the invention.

TECHNICAL FIELD

The present teachings relate generally to lithographic nanopatterning techniques and, more particularly, to the use of lithographic nanopatterning techniques employing multi-longitudinal-mode diode lasers and phase grating beam-splitters as grating beam-splitters.

BACKGROUND

Nano patterning has wide variety of application areas including nanofluidics, nanomagnetics, biophotonics, metamaterial fabrication, among others. Conventional lithography using semiconductor industry tools which have been optimized for high volume manufacturing however is expensive at low volumes. Other fabrication techniques, including nanoimprint lithography often have master and wafer scale issues. Interference Lithography (IL) is often utilized as a large area patterning technique, but demonstrations at wafer-scale are limited. IL with a partially reflective beam-splitter is limited in area by the coherence length of the laser source since the two arms of the interferometer are matched in length at the center of the pattern but vary as the print area is increased in the direction perpendicular to the grating lines. Also, conventional IL typically has larger separation requirements between the beam-splitter and the sample, requiring vibration and air-current controls which are disadvantageous in a manufacturing environment. IL with a grating beam splitter has lower coherence requirements and therefore can be extended to wafer-scale. Additionally, the separation between the grating beam-splitter and the sample can be substantially reduced as compared with the partially reflective beam-splitter configuration, reducing and even eliminating the need for vibration and air current control.

Oblique incidence (often referred to as off-axis illumination) has been used in the past for lithography, primarily in the case of projection lithography. Oblique incidence essentially eliminates unwanted diffraction orders, resulting in a single side band illumination. Off axis or oblique illumination combined with phase shifting grating beam-splitters and transmittance adjusted pupil filter can be used in projection lithography system to improve the resolution. It has also been used in near field techniques such as Talbot lithography.

Light sources often constitute a significant share of the total cost of a large area nanopatterning system. Diode lasers have been used in the past in a variety of ways for fabricating both periodic and non-periodic structures. Diode lasers has been used as the light source in direct laser writing, interference lithography, multi beam laser interference lithography, laser ablation lithography, plasmonic lithography, talbot lithography, and grating beam-splitter aligner systems. LEDs have also been used as source for low-cost lithography in the past. Single transverse-mode diode lasers are commonly available in the market place. Singe frequency (single transverse- and single longitudinal-mode) are available but at a premium price and a reduced power capability as compared with single transverse-, multilongitudinal-mode diode lasers.

Grating beam-splitters can be based on periodic variations in either in amplitude of the phase of either reflection or transmission. Amplitude variations are most often accomplished with metal lines that block transmission or enhance reflection. However, metals involve some loss. Phase variations can be accomplished with lossless materials such as spin-on-glass, but require a 2D patterning in both the period of the variation and the depth of the grating lines. Transmissive grating beam-splitters enable more compact systems that are advantageous in terms of vibration and air-current control.

Thus, there is a need for scalable and cost-effective nanopatterning techniques using low cost light sources such as single-transverse-mode, multiple-longitudinal-mode diode lasers and a spin on glass (SOG) based transmissive diffraction phase grating beam-splitter as grating splitter.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

The present disclosure includes a system for oblique-incidence interferometric-lithography nanopatterning of a sample using a transmissive grating phase grating beam-splitter. The system for oblique incidence nanopatterning includes a first laser configured to produce a first laser beam that is incident obliquely to a transmissive grating beam-splitter. This laser beam is the exposure source for the interferometric lithography. If needed, the system for oblique incidence nanopatterning also includes a polarizer configured to polarize the first laser beam to yield a polarized first laser beam. The system also includes a photoresist-coated sample mounted at a small distance from the grating beam-splitter and mechanical means for adjusting the parallelism between the grating beam-splitter and the sample. The system also includes a second laser configured to produce a second laser beam that is incident substantially at normal incidence to the patterned surface of the grating beam-splitter. The system also includes a second lens system configured to direct the second laser beam to the sample. Diffracted light from two paths: 1) reflection from the grating surface and 2) normal incidence transmission through the grating, reflection from the sample surface and diffraction from the grating; is incident on a screen. The mechanical means are actuated to adjust the surfaces of the grating and the sample to be substantially parallel by observing the interference between diffracted light from two paths on the screen. The system also includes means to control the time of exposure of the sample to the first laser beam.

Implementations of the system for oblique incidence nanopatterning may include a first laser in a single transverse-mode, multiple longitudinal-mode diode laser and the first laser beam has a wavelength of about 405 nm. The second laser beam can be single transverse mode and have a wavelength of about 550 nm. An angle of incidence of the first laser on the grating beam-splitter can be adjusted 20°. The system for oblique incidence nanopatterning may include a first grating beam-splitter and a second grating beam-splitter. The first laser is incident at close to normal incidence at a surface of the first grating beam-splitter, and incident obliquely at a surface of the second grating beam-splitter.

A method for oblique incidence nanopatterning a sample using a grating beam-splitter is also disclosed. The method for oblique incidence nanopatterning a sample using a grating beam-splitter also includes directing a first laser beam from a first laser to a grating beam-splitter surface, where the first laser beam is incident obliquely to the grating beam-splitter surface. The method for oblique incidence nanopatterning a sample using a grating beam-splitter also includes polarizing the first laser beam to yield a polarized first laser beam. The method for oblique incidence nanopatterning a sample using a grating beam-splitter also includes directing the polarized first laser beam from a first lens system to the sample. The method for oblique incidence nanopatterning a sample using a grating beam-splitter also includes directing a second laser beam from a second laser, where the second laser beam is incident at close to normal incidence at the grating beam-splitter surface. The method also includes directing the second laser beam from a second lens system to the sample. Implementations of the method for oblique incidence nanopatterning a sample using a grating beam-splitter may include where the first laser is a single transverse-mode, multi-longitudinal-mode diode laser, the first laser beam has a wavelength of about 405 nm, and the second laser beam has a wavelength of about 550 nm.

A system for oblique incidence nanopatterning a sample using two grating beam-splitters is also disclosed. The system includes a first laser configured to produce a first laser beam that is incident obliquely to a grating beam-splitter surface. The system for oblique incidence nanopatterning a sample using two grating beam-splitters also includes a polarizer configured to polarize the first laser beam to yield a polarized first laser beam. The system also includes a first grating beam-splitter. The system also includes a first lens system configured to direct the polarized first laser beam to the sample through the first grating beam-splitter. The system also includes a second laser configured to produce a second laser beam that is incident at close to normal incidence at the grating beam-splitter surface. The system also includes a second grating beam-splitter. The system also includes a second lens system configured to direct the second laser beam to the second grating beam-splitter for alignment purposes. Implementations of the system for oblique incidence nanopatterning a sample using two grating beam-splitters may include a first single transverse-mode, multi-longitudinal-mode laser, the first laser beam has a wavelength of about 405 nm, and the second laser beam has a wavelength of about 550 nm. A period of the first grating beam-splitter is ½ the period of the second grating beam-splitter. A period of the first grating beam-splitter is 600 nm.

A method for oblique incidence nanopatterning a sample using two grating beam-splitters is disclosed. The method for oblique incidence nanopatterning a sample using two grating beam-splitters also includes directing a first laser beam from a first laser to a grating beam-splitter surface, where the first laser beam is incident obliquely to the grating beam-splitter surface. The method also includes polarizing the first laser beam to yield a polarized first laser beam. The method also includes directing the polarized first laser beam from a first lens system to a first grating beam-splitter and to the sample. The method also includes directing a second laser beam from a second laser, where the second laser beam is incident at close to normal incidence at the grating beam-splitter surface. The method also includes directing the second laser beam from a second lens system to a second grating beam-splitter and to the sample. Implementations of the method for oblique incidence nanopatterning a sample using two grating beam-splitters may include where a period of the first grating beam-splitter is double a period of the second grating beam-splitter. A period of the first grating beam-splitter is 1200 nm, or an angle of incidence of the first laser is 20 degrees.

The features, functions, and advantages that have been discussed can be achieved independently in various implementations or can be combined in yet other implementations further details of which can be seen with reference to the following description.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same, similar, or like parts.

Examples of the present disclosure include apparatus and methods for providing a cost-effective oblique incidence nanopatterning technique using multimode diode laser as source and a spin on glass (SOG) based diffraction grating beam-splitter. The phase grating beam-splitter is engineered to have equal intensities in the first order and zero order under oblique incidence. The presence of only two orders makes the technique less intricate and helps avoid many complexities. The spin-on-glass based grating beam-splitter provides a simple, cost-effective technique. Uniform nanopatterns having a periodicity of 600 nm have been fabricated over an area of 1 cm in diameter using a multimode diode laser. This provides a scalable technique with potential for large area nanopatterning applications.

The present teachings are concerned with advantages of the use of both the grating-based approach and oblique incidence techniques. The combined advantages of these techniques not only reduce the cost but also provide for a simple and effective setup. It enables the use of a low-cost single-transverse, multi-longitudinal mode diode laser as a light source for the lithographic process. This significantly reduces the cost of the setup as compared to the requirement for a single transverse, single longitudinal mode source. As discussed below, the fabrication of an engineered binary phase grating beam-splitter which under oblique incidence provides equal 0th order and −1st order intensities is less stringent than the fabrication of a phase grating beam-splitter that eliminates the normal incidence 0-order and only provides equal intensities in the +1 and −1 orders.

Figure 1:
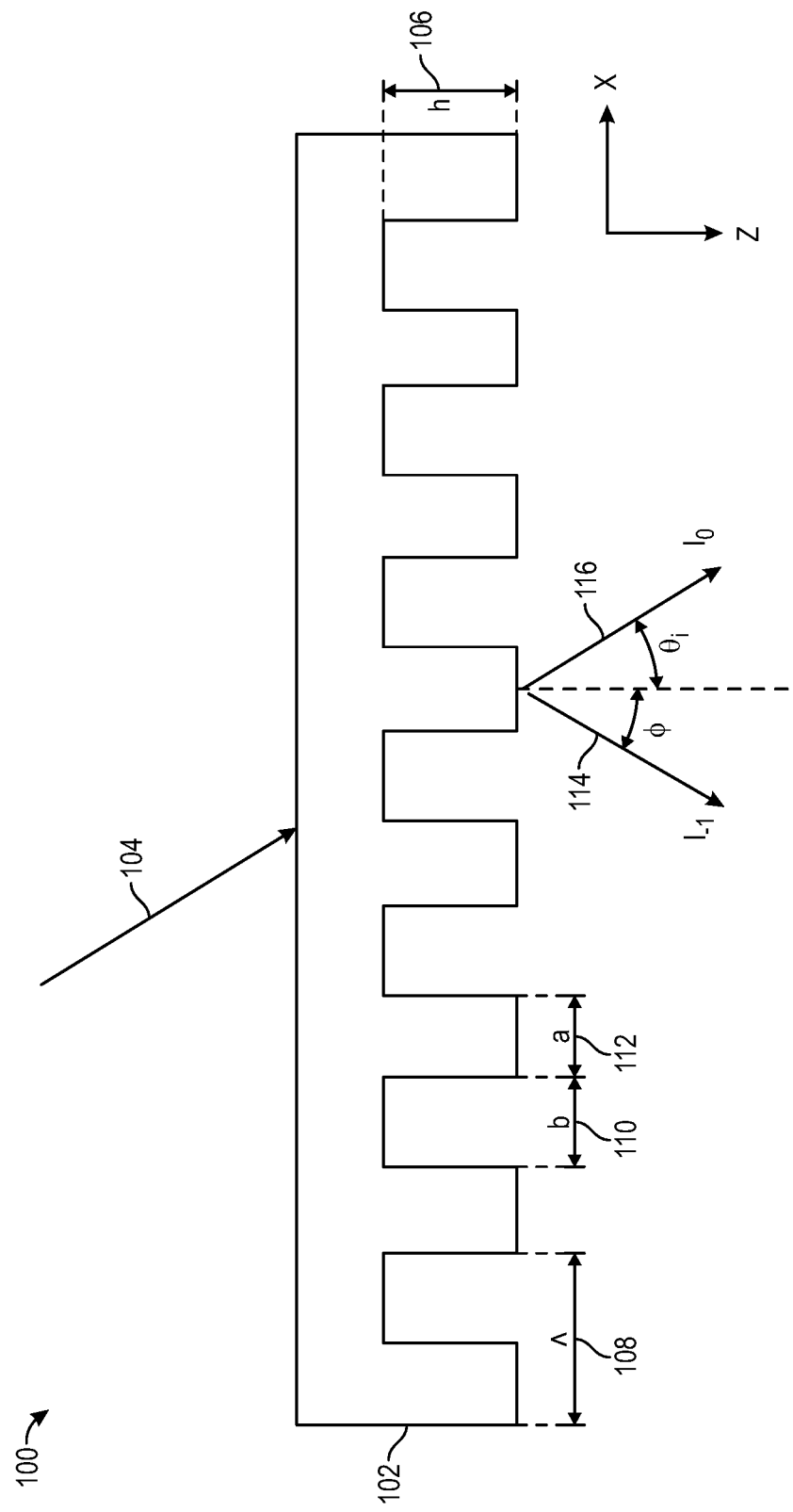
FIG. 1 is a schematic of a diffraction phase grating beam-splitter, in accordance with the present disclosure.

FIG. 1 is a schematic of a diffraction phase grating beam-splitter, in accordance with the present disclosure. Under normal incidence illumination on a binary phase grating beam-splitter, three or more diffracted orders would result, namely: 0th order ($I_0$) and +/−1st order ($I_1$ or $I_{-1}$). FIG. 1 shows a schematic of a diffraction phase grating beam-splitter under oblique incidence illumination 100. Illustrated are the transmitted 0-order $I_0$ intensity (116) and the transmitted $-1^{rst}$ order intensity $I_{-1}$ (114), respectively. In FIG. 1, h is the grating depth (106) of the diffraction phase grating beam-splitter 102, a is grating tooth width 112 of the diffraction grating beam-splitter 102 and b is the spacing 110 between each grating tooth 112. The duty cycle is given by the ratio a/a+b, where $\Lambda$=a+b is the period 108. The phase shift is given by $\rho = 2\pi \Delta n\, h/h$ where $\Delta n$ is the difference in the refractive index of air and the grating beam-splitter material, which can be spin on glass in accordance with the present teachings, and $\lambda$ is the wavelength. The ratio of the first order to zero order intensity can be varied by varying the depth 106 'h' for a particular duty cycle.

Under normal incidence the requirement to reduce the intensity of the transmitted 0-order beam to zero is a phase shift of $\rho=\pi$, and the diffraction efficiency into the −1st and +1st order would be each be about 40.1%. This is achieved when h is $\lambda/(2(n-1))$ and duty cycle is 0.5. Achieving both these criteria simultaneously over a large area is challenging. Hence complete elimination of zero order intensity becomes difficult.

Inclusion of a finite 0-order intensity in the patterning process has significant disadvantages. The interaction between the zeroth order and the first orders results in a z-dependent variation in the pattern with a period $Z_\Lambda$ given by the following equation (1):

$$Z_\Lambda = \frac{\lambda}{1 - \cos\phi} \quad (1)$$

where $\phi$ is the first order diffraction angle. Previous attempts to eliminate detrimental effects of the 0th order intensity have been reported, but these attempts were made at the expense increasingly complex systems, usually with large propagation lengths to separate and recombine the various orders, increasing the sensitivity to vibrations and air current phase shifts.

Phase grating beam-splitters with specific and tailored diffraction efficiencies have been attempted in the past as well. The diffraction efficiency can be adjusted by two known methods: variation of the depth of the grating height; or by variation of the grating profile.

In the present technique, the angle of incidence is selected in such a way that there are only transmitted diffracted orders, namely the 0th order and −1st order. The intensities of 0th order and −1st order can be made equal by adjusting the height (h) of the grating tooth. This is the condition that provides maximum contrast in nanopatterning techniques.

As stated previously, the conventional binary phase grating beam-splitter requires a specific duty cycle ($\rho$) and tooth height (h) for having eliminating the 0th order intensity. From a fabrication perspective it is be more straightforward to fabricate a grating beam-splitter for oblique incidence with equal intensity in 0th order and −1st order. This condition is met for a range of h and p rather than specific values. Instead, the duty cycle could have a range of values and the tooth height can be adjusted appropriately (or vice versa) to give the same intensity in the first order and the zero order. The etch depth and the corresponding duty cycle for having $I_0=I_{-1}$ can be determined by simulation using model calculations.

Figure 2:
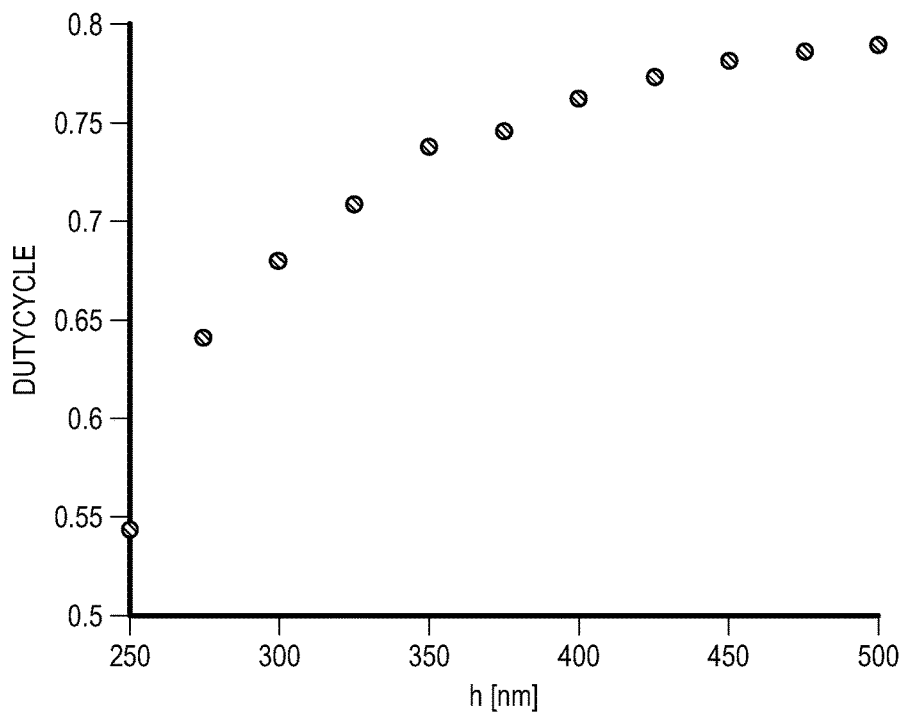
FIG. 2 is a graph showing results obtained from finite difference time domain (FDTD) simulations for a range of tooth heights (h) and the corresponding duty cycle values (ρ) of the phase grating beam-splitter required for attaining equal intensity in 0th order and −1st order for a TE (transverse electric) polarized 405-nm laser source incident at an angle of 20° and a grating period of 600 nm in accordance with the present disclosure.
Figure 3:
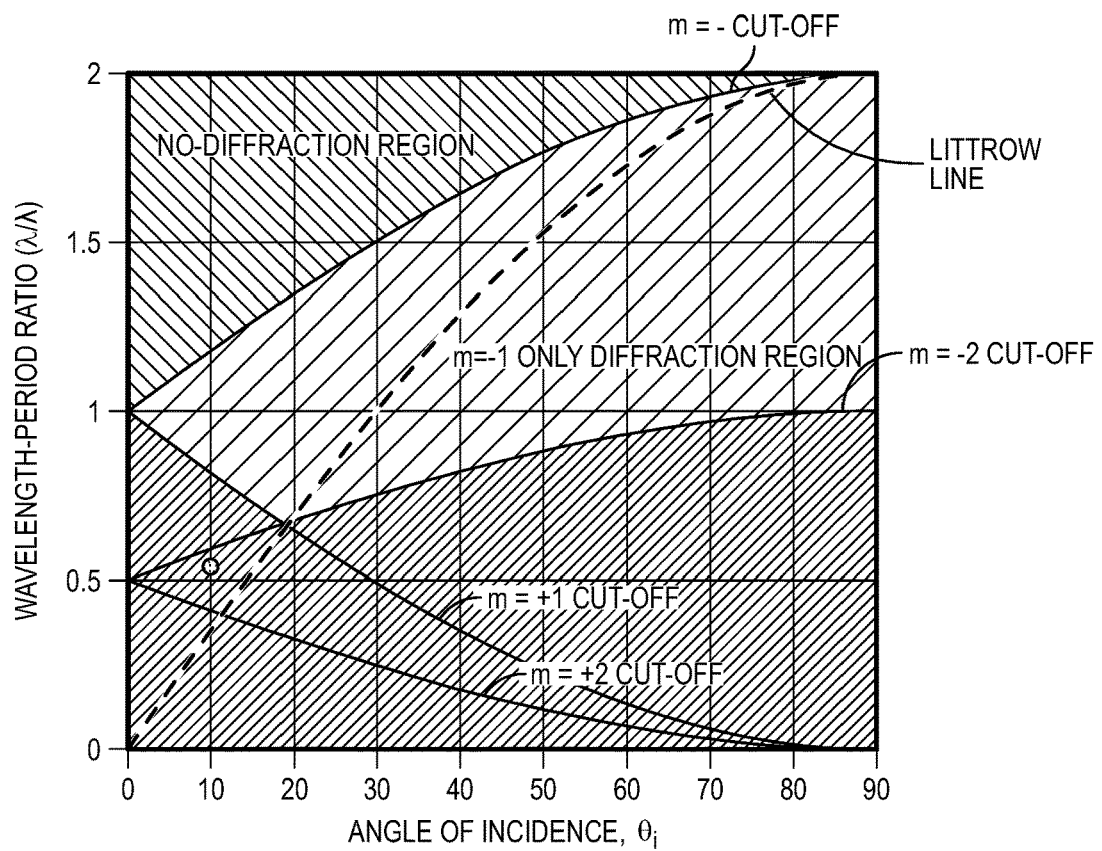
FIG. 3 depicts a map of diffraction order (m) cutoffs as a function of the ratio $\lambda/\Lambda$ (y axis) and angle of incidence $\theta_i$ (x axis), in accordance with the present disclosure.

FIG. 2 is a chart showing results obtained from finite difference time domain (FDTD) simulations for a range of tooth heights (h) and the corresponding duty cycle values ($\rho$) of the phase grating beam-splitter required for attaining equal intensity in 0th order and −1st order for a TE (transverse electric) polarized 405-nm laser source incident at an angle of 20° and a grating period of 600 nm in accordance with the present disclosure. The chart in FIG. 2 shows the results obtained from FDTD simulations for a range of tooth heights (h) and the corresponding duty cycle values ($\rho$) of the phase grating beam-splitter for a period of $\Lambda$=600 nm required for attaining equal intensity in 0th order and −1st order for TE polarized 405 nm laser source incident on a diffraction phase grating beam-splitter at an angle of 20°. The tooth height (h) is varied from 250 nm to 500 nm with an interval of 25 nm. Oblique incidence angle condition for the generation of single side diffraction order is given by the following equation (2):

$$\frac{1}{2}(1 - \sin\theta_1) < \frac{\lambda}{\Lambda} < 1 - \sin\theta_i \quad (2)$$

where $\lambda$ and $\Lambda$ are the wavelength of interest and period of the diffraction phase grating beam-splitter respectively. FIG. 3 maps the diffraction order (m) cutoffs as a function of the ratio $\lambda/\Lambda$ (y axis) and angle of incidence $\theta_i$ (x axis). It shows the m=−1 only diffraction order region.

FIG. 3 depicts a map of diffraction order (m) cutoffs as a function of the ratio $\lambda/\Lambda$ (y axis) and angle of incidence $\theta_i$ (x axis), in accordance with the present disclosure.

TABLE 1

| Wavelength $\lambda$ (nm) | Period $\Lambda$ |
|---|---|
| 405 | 202.5 nm-603 nm |
| 355 | 177.5 nm-529 nm |
| 193 | 96.5 nm-287 nm |

Table 1 shows the range of period ($\Lambda$) that can be achieved theoretically for 3 photoresist sensitive wavelengths, 405 nm, 355 nm, and 193 nm. Spin on glass is a soft medium that is easy to etch while maintaining good controllability, providing full transparency at both 405- and 355-nm wavelength sources. The low temporal coherence requirement for the grating beam-splitter-based approach is a primary motivation to utilize a diode laser as a source for the experiments described herein. The absence of a third order ensures that there is no issue of z dependence. It should be noted that other media having full transparency as described may be used in the system and methods of the present disclosure, such as chrome on glass or other media known to those skilled in the art. The Littrow line (dotted) is the locus where the $\phi=\theta$, and the interference pattern on the sample is normal to the substrate surface, which is the optimal condition for subsequent pattern transfer steps. The shaded region bounded by the m=−1 cutoff, the m=−2 cutoff and the m=+1 cutoff is the available parameter space where there are only m=0 and m=−1 transmitted orders.

EXPERIMENTAL

A) Grating beam-splitter fabrication: A 2" round, 6 mm thick, fused silica glass piece was used as substrate for making the grating beam-splitter. A spin-on-glass coating was spin-coated onto surface of the substrate. The SOG coated substrate was then baked at a temperature of 200° C. on a hotplate. The refractive index of SOG after baking was measured in an ellipsometer and found to be 1.46 at 355 nm. This was in good agreement with the Cauchy coefficients provided by the manufacturer. A layer of Back-Anti-Reflection-Coating (BARC)-ICON 16 was spin-coated on top of the SOG layer at a thickness of about 150 nm. This was followed by spin coating of a layer of i-line negative photoresist (NR7-500) to a thickness of about 500 nm. The next step was to make use of interferometric lithography, using a Lloyds mirror beam-splitter arrangement to make a one-dimensional pattern of period 600 nm on the photoresist coated substrate. The laser source used was a frequency-tripled Coherent infinity 40-100 YAG laser at 355 nm. The energy dosage was close to 128 mJ/cm². The exposed PR-BARC-substrate was baked and developed in a developer solution. The substrate was hard baked after the development to provide additional mechanical stability to the photoresist pattern prior to RIE etching. An oxygen plasma was used to etch the BARC layer. Gas flow rate, process pressure and rf power were 15 sscm, 15 mtorr and 30 W, respectively. The photoresist patterned glass substrate was then subjected to reactive ion etching (RIE) to transfer the photoresist pattern into the SOG layer. Next, $CF_4$ gas was used to etch the SOG layer at a gas flow rate of 21 sscm, pressure of 15 mTorr, and rf power of 100 W, respectively. Following the SOG etch, the remaining photoresist layers were removed using an acetone spray gun and the remaining layer of BARC was etched away using an oxygen plasma. As stated earlier the initial etch depth was taken from the simulations. The required etch depth was obtained empirically after few attempts by iteratively evaluating the optical performance, specifically the ratio of −1-order to 0-order intensity and adjusting the etching time to get substantially equal intensities.

B) Sample Patterning process: Two separate schemes were evaluated. First, a single grating beam-splitter was used, followed by the use of two grating beam-splitters to further case the alignment issues. Drawbacks of the first scheme and how the second scheme provides an improved process are discussed herein.

Figure 4:
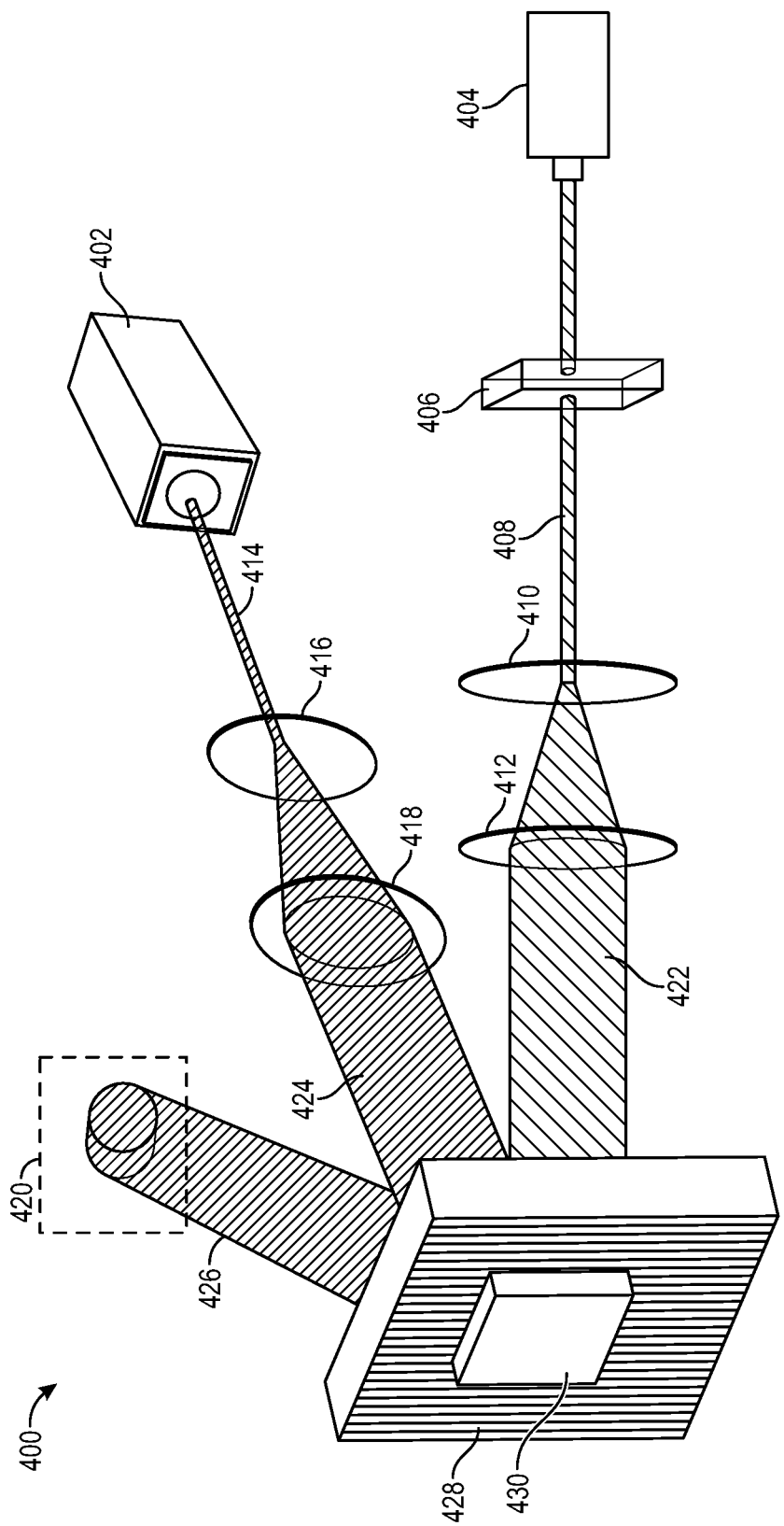
FIG. 4 depicts a schematic of a patterning setup with one grating beam-splitter, in accordance with the present disclosure.

FIG. 4 depicts a schematic of a patterning setup with one grating beam-splitter grating beam-splitter, in accordance with the present disclosure. A patterning system 400 using a single grating beam-splitter 428 is illustrated. The method for fabrication of a grating beam-splitter, as described, includes forming a grating structure using a photolithographic process to etch a structure into a spin-on-glass layer on a fused silica substrate and monitoring a depth of the etched structure in the spin-on-glass layer to optimize the functionality of the grating beam-splitter. The patterning process involves two steps. A sample surface 430 is initially made parallel to the grating beam-splitter 428 surface using green laser 402. The green laser 402 emits a beam 414 which also passes through a first lens 416 and a second lens 418, both part of a second lens system. The green laser 424 is adjusted to normal incidence on the grating beam-splitter surface 428 by use of a tip-tilt mount (the retroreflection from the grating beam-splitter surface is directed substantially back to the laser source with the use of a pinhole screen (not shown). The first order diffracted light 426 reflected from grating beam-splitter 428 surface, and the light transmitted through the grating beam-splitter 428, reflected from the sample 430 and diffracted in transmission from grating beam-splitter 428 interfere on a screen 420. The tip tilt stage, not shown, is used to finely tune the position of the sample 430 until both the sample 430 and grating beam-splitter 428 surface are parallel to a high degree. The tuning is done until the interference pattern observed on the screen 420 typically has about 4-5 fringes resulting from residual curvature of the sample and the grating beam-splitter. Applicable samples of the present disclosure can be coated with an anti-reflective coating.

The exposure source is a single transverse-mode, multi-longitudinal mode diode laser 404. As needed, the diode laser 404 path includes a polarizer 406, the polarized beam 408 enters at least a first lens 410 and a second lens 412, both being part of a first lens system to expand the beam cross-section to fill the desired exposure area. The angle of incidence of 405 nm laser is substantially at the Littrow angle where the 0-order and the −1-order diffraction directions are symmetric with respect to the grating surface 428.

Once the alignment is done the green laser 402 path is blocked, and the 405 nm diode laser 404 path is opened, and the exposure is done. This scheme can exhibit inherent disadvantages which can be understood from further inspection of FIG. 5A. It is known that the laser has many longitudinal modes and hence different wavelengths represented by $\lambda_k$.

Figure 5A:
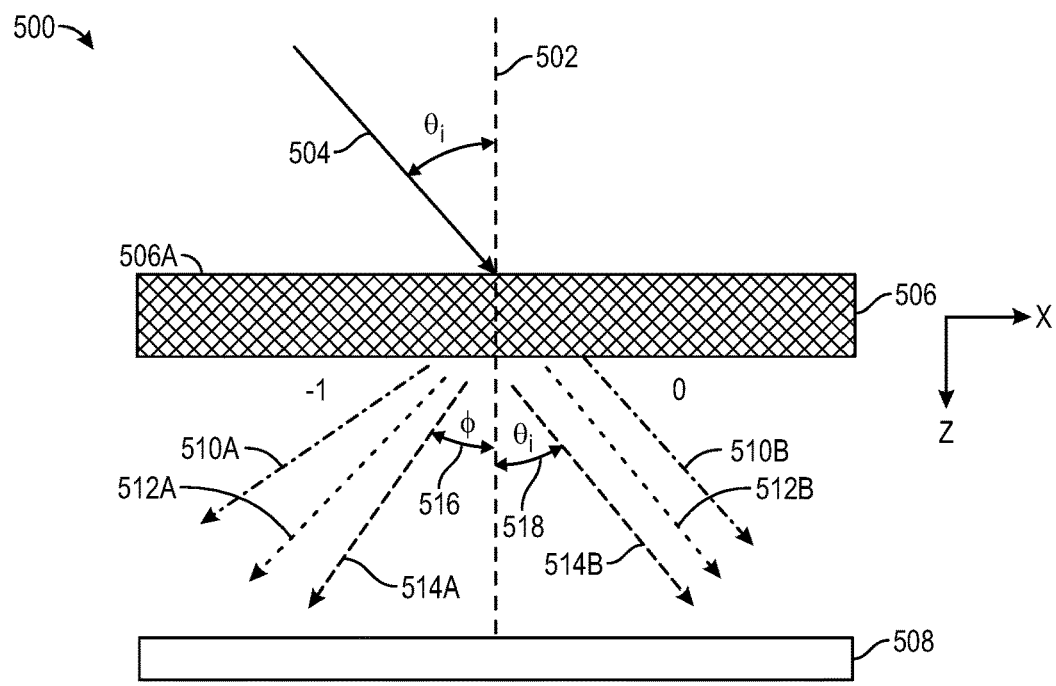
FIG. 5A is a schematic illustrating an oblique incidence of multimode laser on a diffraction phase grating beam-splitter, in accordance with the present disclosure.

FIG. 5A is a schematic illustrating an oblique incidence of multimode laser on a diffraction phase grating beam-splitter, in accordance with the prior art. A multimode laser 504 is shown as part of a system 500, being incident obliquely on a grating beam-splitter 506 so that only $-1^{st}$ and $0^{th}$ order are produced. A normal 502 to the grating beam-splitter surface 506A is shown in the schematic, as well as a target sample 508.

Different wavelengths are represented by arrows indicating a first wavelength 510A, 510B, second wavelength 512A, 512B, and third wavelength 514A, 514B wherein $\lambda_{510} > \lambda_{512} > \lambda_{514}$. Each longitudinal mode interferes only with its corresponding longitudinal mode from the opposite direction since only pairs are stationary in time, according to the following relationship:

$$\langle e^{i\omega_k t} e^{-i\omega_j t} \rangle = \delta_{k,j}.$$

For oblique incidence of the multimode laser 504, the zeroth order angle is the same for all the wavelengths 510B, 512B, 514B and is equal to incident angle $\theta_i$ 518, but the first order diffraction angle 516 is different for each wavelength 510A, 512A, 514A as shown in FIG. 5A. Let the first order diffraction angle 516 for each wavelength $\lambda_k$ be represented by $\phi_1, \phi_2, \phi_3, \ldots \phi_k$. Therefore, the intensity equation has a z-dependent term (z is the direction into the photoresist perpendicular to the sample surface) because the difference in the z-components of the k vector of interfering wavelengths is not zero as they are not symmetrical with respect to sample plane. Assuming n-modes with intensities $A_i$ the electric field amplitude is given by Equation (3):

$$E(x, z) = \sum_{k=1}^{n} \sqrt{A_k} \left( e^{\left(2\pi i \frac{\sin \theta_{ik}}{\lambda_k} \cdot x + 2\pi i \frac{\cos \theta_{ik}}{\lambda_k} \cdot z\right)} + e^{\left(-2\pi i \frac{\sin \phi_k}{\lambda_k} \cdot x + 2\pi i \frac{\cos \phi_k}{\lambda_k} \cdot z\right)} \right) \quad (3)$$

Since the interference happens only between individual longitudinal modes the intensity is given by Equation (4):

$$I(x, z) = \sum_{k=1}^{n} 2 A_k \left\{ 1 + \cos \left[ \frac{2\pi(\sin \theta_i - \sin \phi_k)}{\lambda_k} x + \frac{2\pi(\cos \theta_i - \cos \phi_k)}{\lambda_k} z \right] \right\} \quad (4)$$

The diffraction angles vary with the wavelength with $\sin \phi_k = \sin \theta_i - \lambda_k/\Lambda$. Therefore, the term varying in x is the same for all wavelengths and is equal to $2\pi/\Lambda$. Therefore the interference patterns are at the period of the grating and there is no moiré pattern in x direction. But the term $\cos \theta_i - \cos \phi_k$ is different for the various $\lambda k$ as $\theta i$ is same for all wavelengths and $\phi$ is different for each wavelength, as shown in equation (5):

$$I(x, z) = 2 \sum_{k=1}^{n} A_k \left\{ 1 + \cos \left[ \frac{2\pi}{\Lambda} x + \frac{2\pi(\cos \theta_i - \cos \phi_k)}{\lambda_k} z \right] \right\} \quad (5)$$

Thus, the interference patterns for each mode are at the same period, but are tilted relative to each other, resulting in a z-dependence of the total pattern.

Figure 5B:
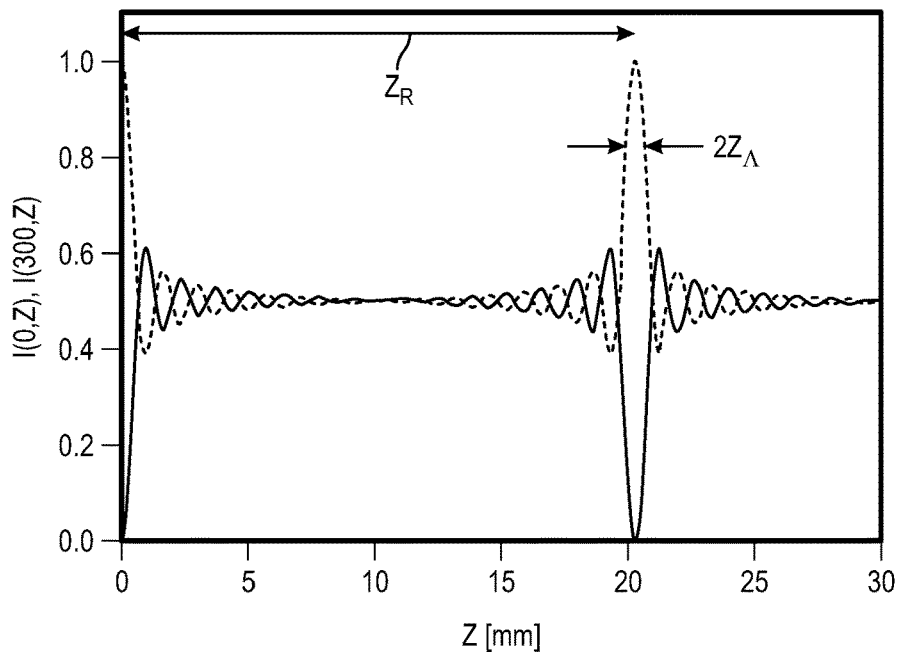
FIG. 5B is a graph depicting a distance and parallelism constraint associated with the multiple longitudinal modes of a diode laser for a single grating beam-splitter.

The result of this tilt is that the phases of the individual modal pattern shift relative to each other as the gap between the grating surface and the exposure plane inside the photoresist layer. This is shown in FIG. 5B which shows the dependence of the exposure contrast as the grating beam-splitter-wafer gap is varied. FIG. 5B is a graph depicting a distance and parallelism constraint associated with the multiple longitudinal modes of a diode laser for a single grating beam-splitter. The maximum contrast is obtained when each of the interference patterns from the different modes are in phase, the contrast decreases as a result of the different tilts of the self-interference patterns of each mode relative to the wafer normal with a width $Z_A$. The dashed curve is at a peak of the interference pattern; the solid curve at a minimum. Since the modes are equally spaced the pattern repeats at a larger gap width $Z_R$ determined by the mode spacing. This graph is plotted for a diode laser with 40 modes of equal power separated by 0.025 nm for a total linewidth of 1 nm. It should be noted that the photoresists of the present disclosure can include positive tone photoresists or negative tone photoresists. With positive photoresists, UV light is directed toward material areas to be removed. In the use of negative photoresists, exposure to UV light causes a polymerization or other reaction within the photoresist, and the areas not exposed to UV radiation can be removed.

The present technique as described herein employs a system for oblique incidence nanopatterning a sample using a grating beam-splitter, including a grating beam-splitter on a tip-tilt adjustable mount, a photoresist coated sample mounted on a tip-tilt-z adjustable mount, an alignment system to allow adjustment of the tip-tilt adjustable mounts so that a surface of the grating beam-splitter and a surface of the photoresist coated sample are substantially parallel, a laser operating at a wavelength suitable for exposure of the photoresist, an optical system to deliver a laser beam at oblique incidence to the grating beam-splitter to expose the photoresist coated sample, and means to control an exposure dose of the laser beam at the sample. The laser includes a single transverse-mode, multi-longitudinal-mode diode laser, wherein in certain examples, the wavelength of the laser can be, but is not limited to 405 nm. The oblique incidence in the system is chosen as a Littrow angle for the grating beam-splitter to provide a symmetric angular distribution on the photoresist. The oblique incidence is further selected to produce a single zero order transmission and no more than one diffractive order transmission. The optical system to deliver the laser beam includes an optional polarizer and a lens system to expand an optical beam from the laser to cover a desired exposure area on the sample. The alignment system includes a laser at a wavelength that does not substantially expose the photoresist, an optical system to expand the laser beam to cover an exposure area on the sample and to deliver the laser beam substantially at normal incidence to a surface of the grating beam-splitter, and a screen to visualize interference between a portion of the laser beam diffracted from a surface of the grating beam-splitter, and a portion of the laser beam transmitted by the grating beam-splitter, reflected from a surface of the sample and diffracted from the grating beam-splitter. Exemplary examples of samples can include a photoresist that comprises either a positive tone photoresist or a negative tone photoresist. A z-distance of the photoresist coated sample is adjustable in a range of from 0 to about 30 mm. Exemplary samples of the present disclosure include an anti-reflective coating on one or more surfaces.

Figure 6:
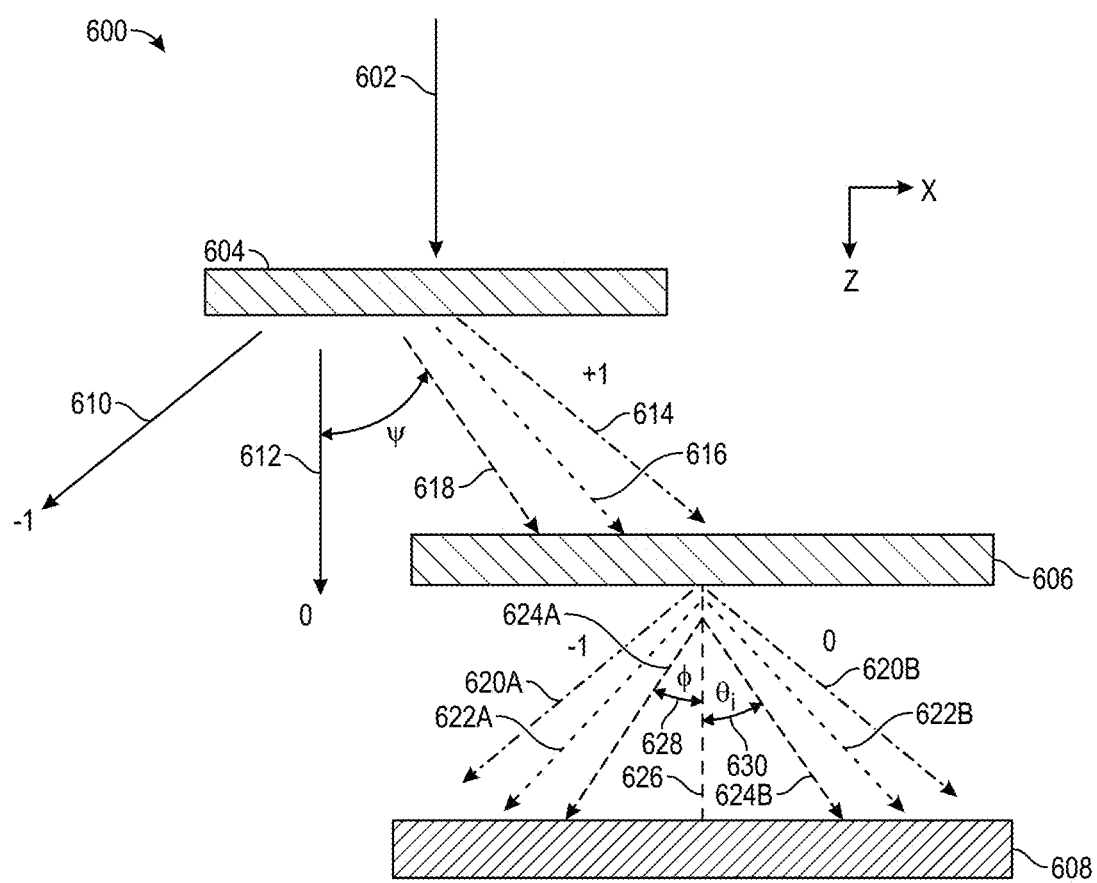
FIG. 6 is a schematic illustrating a Z invariant scheme, where a first order diffraction of a first grating beam-splitter (Grating beam-splitter 1) acts as a source for the second grating beam-splitter (Grating beam-splitter 2), in accordance with the present disclosure.

FIG. 6 is a schematic illustrating the z-invariant scheme of the present disclosure, where a first order diffraction of a first grating beam-splitter (Grating beam-splitter 1) acts as a source for the second grating beam-splitter (Grating beam-splitter 2), in accordance with the present disclosure. In order to avoid the z-dependence of the intensity pattern, patterning with a double grating beam-splitter is used. In this system 600, first order diffraction of first grating beam-splitter (Grating beam-splitter 1) 604 acts as a source for the second grating beam-splitter (Grating beam-splitter 2) 606. The scheme is shown in FIG. 6. The Littrow angle is the angle of incidence at which zeroth order diffraction angle is equal to the $-1^{rst}$-order diffraction angle. A Littrow angle $\theta_\Lambda$ for a grating of period A is given by $\sin \theta_L = \lambda/(2\Lambda)$. When light is incident in the Littrow condition ($\theta i = \theta_\Lambda$) on Grating beam-splitter 2, $\theta i = \theta_0 = \phi$, where $\theta i$, $\theta_0$, $\phi$ are the incident angle, zeroth order diffraction angle, and first order diffraction angle of Grating beam-splitter 2 respectively. Further indications of a 405 nm multimode laser 602 direction, a first grating beam-splitter 604 or grating beam-splitter 1, a second grating beam-splitter 606 or grating beam-splitter 2, a sample 608 are illustrated schematically. A −1 order 610, a normal incident 612 are also indicated, as are a first wavelength 614, a second wavelength 616, and a third wavelength 618 exiting the first grating beam-splitter 604. Indications of a −1 order first wavelength 620A, 1 order second 622A, and −1 order third wavelength 624A are shown exiting the second grating beam-splitter 606. Also indicated are a zeroth order first wavelength 620B, zeroth order second wavelength 622B, and zeroth order third wavelength 624B exiting the second grating beam-splitter 606. Also shown are a normal incidence angle 626, first order diffraction angle 628, and zeroth order diffraction angle $\theta i$ 630. The period of grating beam-splitter 2 is equal to the desired period of patterning. In an exemplary example, a period of the Grating beam-splitter 1 604 is exactly ½ that of Grating beam-splitter 2 606 and so the first order diffraction angle of Grating beam-splitter 1 604 is exactly the same as Littrow angle for Grating beam-splitter 2 606.

This can be easily understood from the diffraction equation of Grating beam-splitter 2:

$$\sin \theta_i - \sin \phi = \frac{\lambda}{d} \quad (6)$$

Since $$\sin \theta_i = \sin \Psi = \frac{\lambda}{2d} \quad (7)$$

$$\frac{\lambda}{2d} - \sin \phi = \frac{\lambda}{d}$$

Hence $\theta i = \phi$ for a particular wavelength. Therefore, in this configuration the different longitudinal mode wavelengths ($\lambda 1, \lambda 2 \ldots \lambda n$) will preserve the angle symmetry with respect to the normal because $\theta i = \phi$ for all wavelengths. Hence the z dependent term in the intensity function of Eq. (5) is eliminated. As shown in FIG. 6, the longer wavelengths diffract more compared to shorter wavelengths but the symmetry with respect to the normal is maintained for all wavelengths. Further analysis of the situation where in the period of Grating beam-splitter 2 is not exactly half of the Grating beam-splitter 1 and the case where Grating beam-splitter 1 is slightly tilted instead of perfectly normal to the incident laser beam have also been analyzed.

Misalignment of the system will reintroduce a z-dependence. Two examples are a slight tilt φ between the two grating beam-splitters, equivalent to the misaligning the input beam by an angle φ from normal incidence, and a deviation of the 2× relationship between the grating periods, one at d and the other at 2d+ε. Following the same procedure as outlined above for the single grating case, the results are $$Z_{\Lambda 2 tilt} \sim \frac{\sigma \Lambda^2 \cos \theta}{2\Delta \lambda} \left[ \frac{2\Lambda(\cos \theta)^2}{\lambda_0 \varphi} \right]$$

and $$Z_{R2 tilt} \sim \frac{2\Lambda^2 \cos \theta}{\delta \lambda} \left[ \frac{2\Lambda(\cos \theta)^2}{\lambda_0 \varphi} \right]. \quad (8)$$

In each case the expressions are written as the dephasing (repeat) distance for the oblique incidence, single grating case times an enhancement inversely proportional to the deviation from alignment. The comparable expressions for the grating period mismatch case are:

$$Z_{\Lambda 2 period} \sim \frac{\sigma d^2 \cos \theta}{2\Delta \lambda} \left[ \frac{2d^2 (\cos \theta)^2}{\lambda_0 \varepsilon} \right]$$

and $$Z_{R2 period} \sim \frac{2d^2 \cos \theta}{\delta \lambda} \left[ \frac{2d^2 (\cos \theta)^2}{\lambda_0 \varepsilon} \right]. \quad (9)$$

Certain examples have used 600 nm period (Grating beam-splitter 2) and 1200 nm period (Grating beam-splitter 1). Grating beam-splitter 2, as discussed previously, has equal intensity in first order and zeroth order diffraction when light is incident at Littrow angle. Grating beam-splitter 1 theoretically should be an ideal binary phase grating beam-splitter where almost all of the incident energy is in the first orders. In exemplary examples of the present disclosure, the first order intensity is about 6 times that of the zeroth order intensity and hence is not decreasing the overall power efficiency of the system by a large margin. The fabrication process of Grating beam-splitter 1 is similar to that of Grating beam-splitter 2 except for the etch depth.

Figure 7:
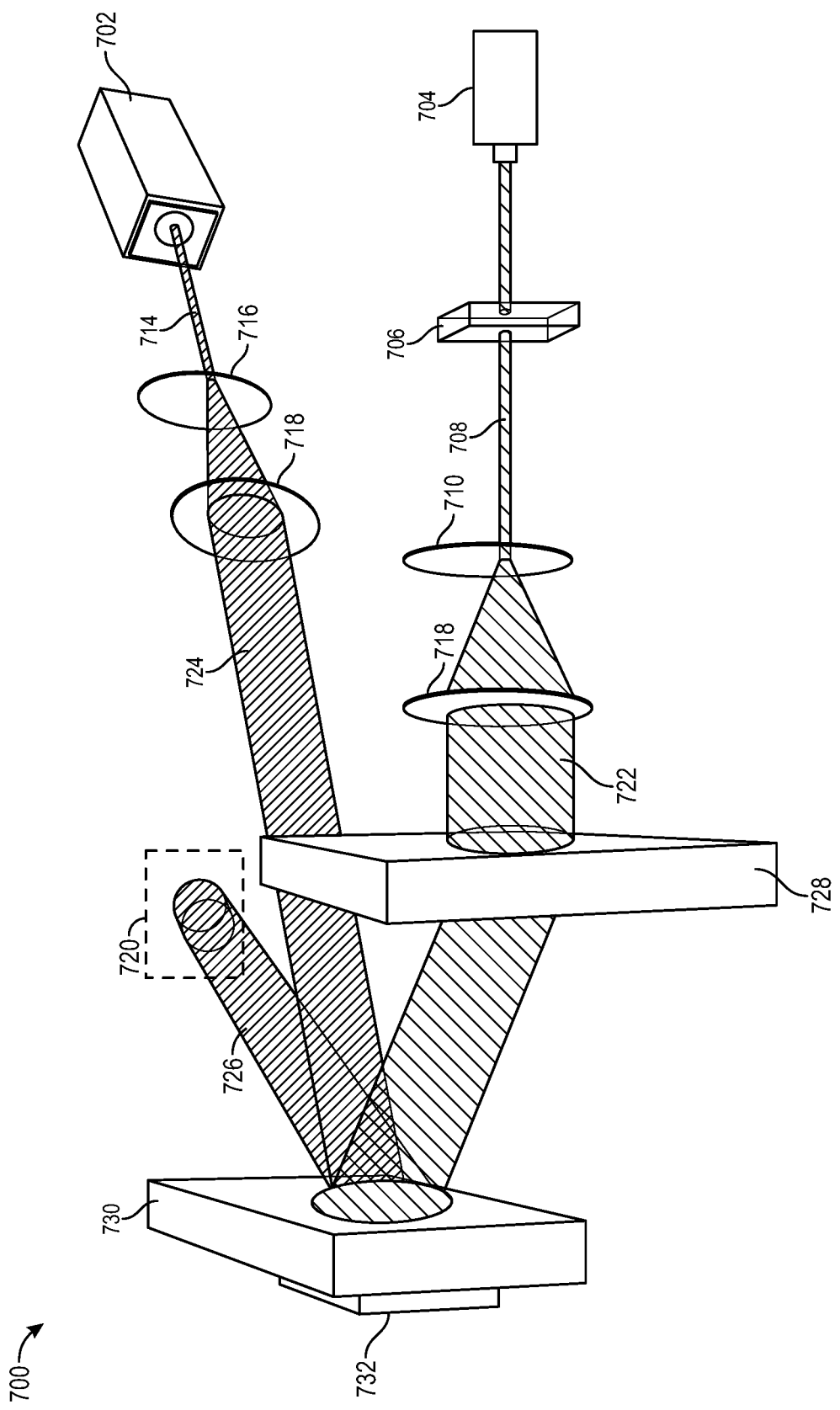
FIG. 7 is a schematic of a patterning setup utilizing two grating beam-splitters, in accordance with the present disclosure.

FIG. 7 is a schematic of a patterning setup utilizing two grating beam-splitters, in accordance with the present disclosure. FIG. 7 shows the patterning setup and system 700 in perspective view. A 405 nm diode laser 704 has normal incidence on grating beam-splitter 1 728 and is obliquely incident on grating beam-splitter 2 730 after diffraction from the grating beam-splitter 1 728. The path of the 405 nm diode laser 704 passes through a polarizer 706, followed by the beam 708 passing through a first lens system including a first lens 710 and a second lens 712. The beam 722 then passes through the first grating beam-splitter 728, the second grating beam-splitter 730, and finally the sample 732. The green laser 702 emits a beam 714 which also passes through a first lens 716 and a second lens 718, both part of a second lens system. The green laser 724 is directed onto the second grating beam-splitter 730. Both the sample 732 and the grating beam-splitters 728, 730 are held in tip-tilt stages. The first order light 726 reflected from sample 732 and from the second grating beam-splitter 730 surface are made to interfere on a screen 720 to provide a sensor for parallelism of the grating beam-splitter and substrate surfaces.

Both the grating beam-splitters 728, 730 are initially made parallel to each other by making them both perpendicular to the incident collimated beam using back reflection. A 1 mm aperture is used for this purpose and is placed about 15 inches away from grating beam-splitter 1. After placing the sample, the sample surface is made parallel to the grating beam-splitter surface using green laser. The green laser is incident obliquely on grating beam-splitter 2. Both the sample and the grating beam-splitter are held in tip tilt stages. And the sample is on xyz stage and the precision in the z direction is 10 µm. The sample and grating beam-splitter are made highly parallel (4-5 interference fringes) as discussed in regard to FIG. 4. Once the alignment is done the sample 732 is moved as close as possible to the second grating beam-splitter 730. During the course of this movement tip-tilt screws may have to be slightly adjusted so that interferogram maintains only about 4-5 fringes.

In an exemplary system for oblique incidence nanopatterning a sample using two grating beam-splitters to provide increased alignment tolerance, the system includes, as described herein, a first grating beam-splitter at a first period on a first tip-tilt adjustable mount, a second grating beam-splitter at a second period mounted on a second tip-tilt mount, a mounting arrangement such that optical beams diffracted from the first grating beam-splitter are incident on a surface of the second grating beam-splitter, a photoresist coated sample mounted on tip-tilt-z adjustable mount behind the second grating beam-splitter, an alignment system to allow adjustment of the first and second tip-tilt mounts so that a surface of the first grating beam-splitter, the surface of the second grating beam-splitter and a surface of the photoresist coated sample are substantially parallel, a laser at a wavelength suitable for exposure of the photoresist, an optical system to deliver a laser beam at substantially normal incidence to the first grating beam-splitter, and a means to control an exposure dose of the laser beam at the sample. A period of the first grating beam-splitter can be substantially half of a period of the second grating beam-splitter, in certain examples. For example, the period of the first grating beam-splitter can be in a range from half of the wavelength of the laser to 2 microns. The laser can be a single transverse-mode, multi-longitudinal-mode diode laser. The operating wavelength of the laser is substantially 405 nm, but may also operate in ranges from 0.2-1.8 µm in certain examples. The optical system to deliver the laser beam can include a polarizer and a lens system to expand the laser beam from the laser to cover a target exposure area, which in examples can range from 100 nm to 8-inches in size. The alignment system further includes a laser at a wavelength that does not substantially expose the photoresist on the sample, an optical system to expand the laser beam to cover an exposure area on the sample and to deliver the laser beam substantially at normal incidence to a surface of the second grating beam-splitter, and a screen to visualize interference between a portion of the laser beam diffracted from a surface of the second grating beam-splitter, and a portion of the laser beam transmitted by the second grating beam-splitter, reflected from a surface of the sample and diffracted from the second grating beam-splitter. The interference can then be adjusted as necessary. As in other examples described herein, the oblique incidence of the system is chosen to produce a zero order transmission and no more than one diffractive order transmission.

Figure 8:
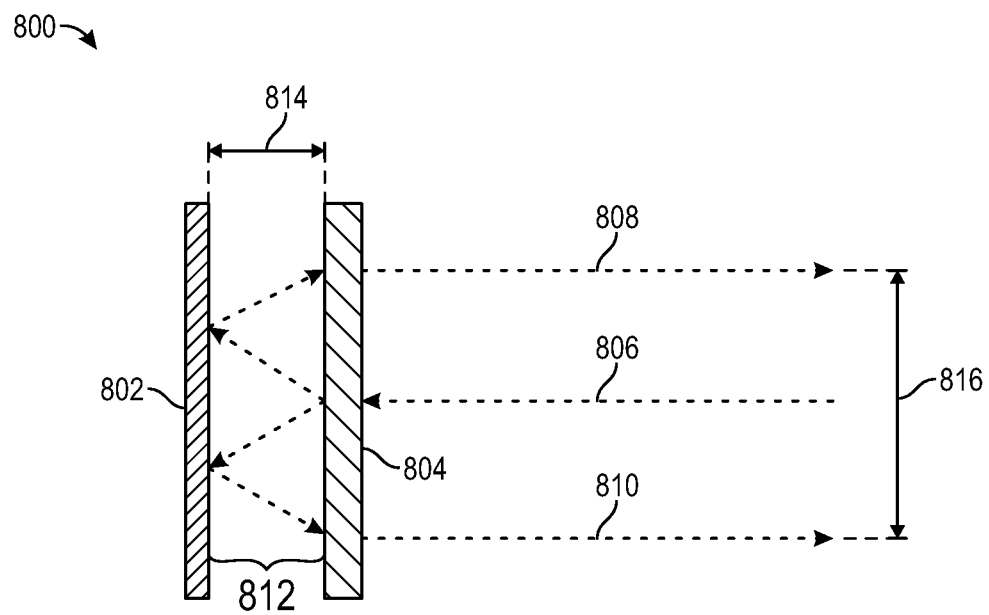
FIG. 8 is a schematic of a gap measurement scheme, in accordance with the present disclosure.

The distance between the grating beam-splitter and sample can be estimated if needed using the scheme as shown in FIG. 8. A green laser spot is incident normal to grating beam-splitter and first order reflection from the sample emerges parallel to incident beam after re-transmission through the grating beam-splitter. The distance between these orders is proportional to the gap between grating beam-splitter and sample and in our case ($\lambda$=532 nm, $\Lambda$=600 nm) it is 3.8 times the gap. A 1 mm spot was used for this purpose, which can move the sample as close as 260 µm to the grating beam-splitter.

FIG. 8 is a schematic of a gap measurement scheme, in accordance with the present disclosure. For this measurement, the sensor laser beam 816 is not expanded, is about 1 mm in diameter, and is incident normal to grating beam-splitter surface 804. Both the +1 and −1 diffraction orders progate to the sample surface 802, are reflected back to the grating 804 and are diffracted a second time at the grating to give two beams parallel and counterpropagating to the incident beam. The distance between these two beams is proportional to the grating beam-splitter to sample distance 804.

The longitudinal mode spacing $\lambda$ in the laser can be approximated from the expression $$\Delta\lambda = \frac{\lambda_m^2}{2*n*L} \tag{8}$$

where $\lambda_m$ is the central wavelength, n is the refractive index of the lasing medium, and L is the cavity length. As per the data sheet of the diode laser, the spectral linewidth (FWHM) was found to be close to 1 nm. Assuming the cavity length is between 800 µm and 1300 µm, the number of longitudinal modes would be between 24 and 40.

Figure 9A:
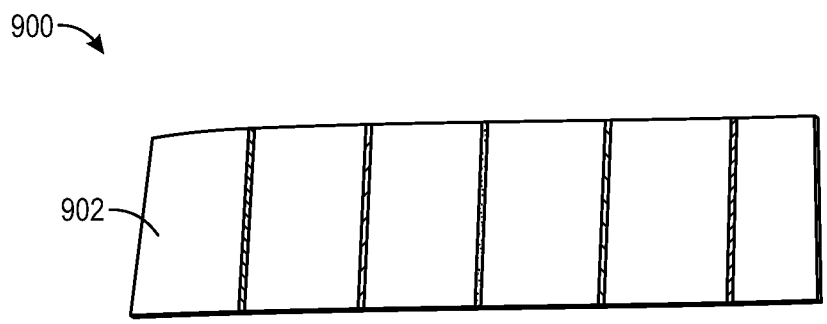
FIGS. 9A-9C depict a photograph of a patterned silicon sample using single spatial mode diode laser as source, a photograph of a developed sample patterned using diode laser based oblique incidence patterning technique, and a scanning electron microscope (SEM) image, respectively, in accordance with the present disclosure.
Figure 9B:
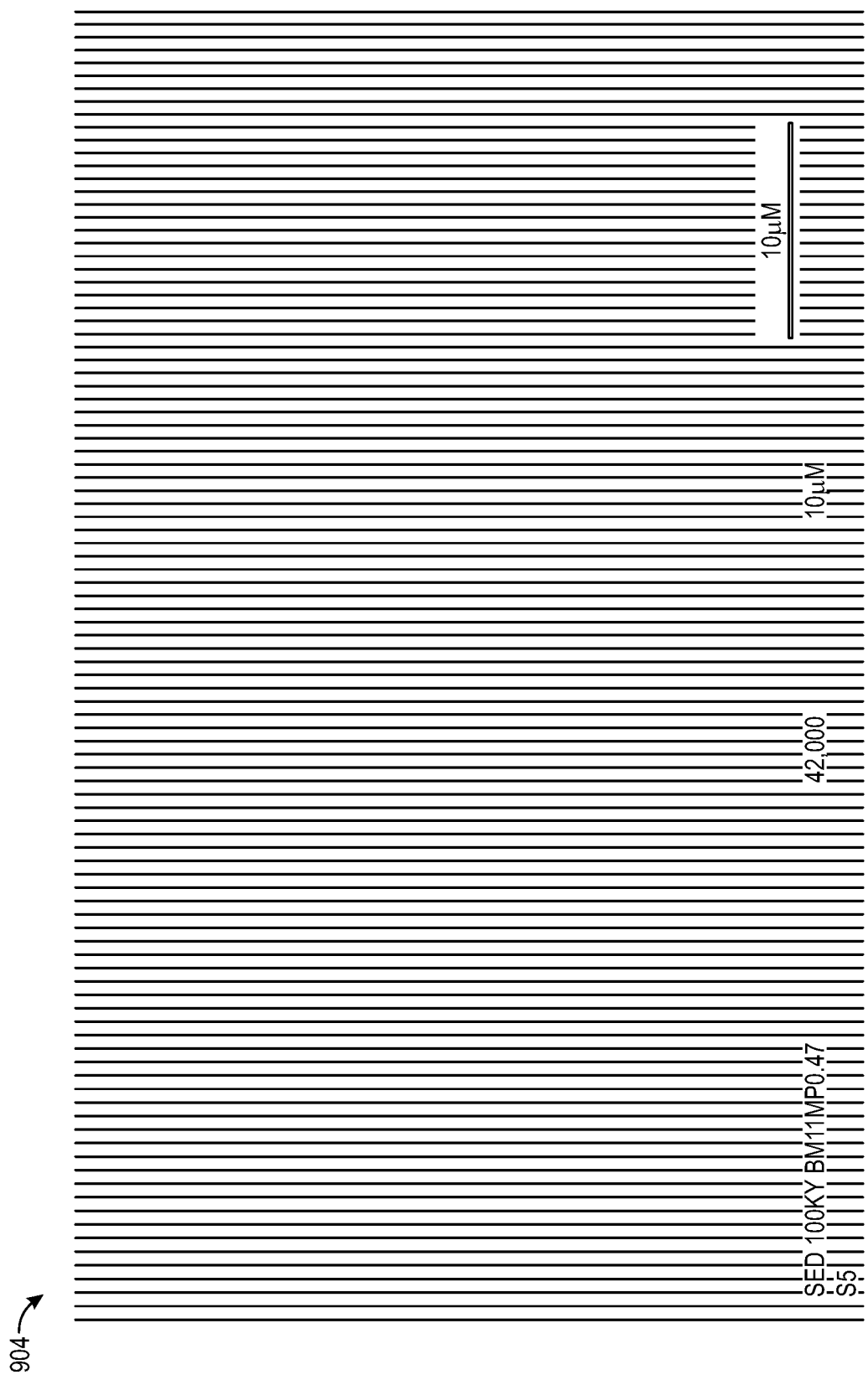
Figure 9C:
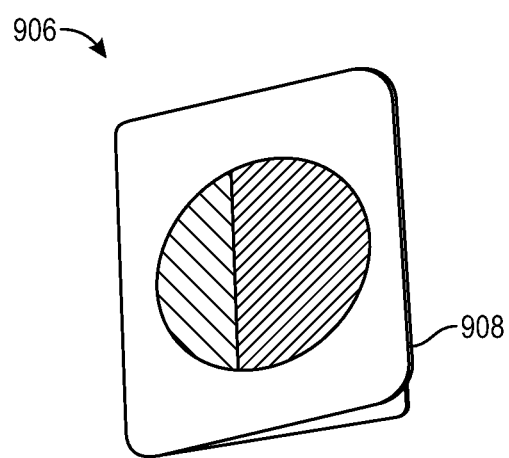

Prior to the grating beam-splitter-based experiment the diode laser was used as source to expose a silicon sample coated with positive photoresist SPR 505 in a Lloyd's mirror Interference Lithography arrangement to create a one-dimensional pattern. The developed sample is shown in FIGS. 9A-9C. FIGS. 9A-9C depict schematics of a patterned silicon sample using single spatial mode diode laser as source, a photograph of a developed sample patterned using diode laser based oblique incidence patterning technique, and a scanning electron microscope (SEM) image, respectively, in accordance with the present disclosure. FIG. 9A is a schematic 900 showing a silicon sample 902 patterned in a Lloyd's mirror interference lithography setup using single spatial mode diode laser as source.

Interference lithography occurred only in very small regions seen as colored bands in the photo of the developed sample 902. This shows that the diode laser had several longitudinal modes and had very short coherence length. The width of each band is ~300 µm and the repeat distance is 9.6 mm. Fitting to a simple model gives a mode spacing of $\Delta\lambda$~0.025 nm (and with the overall bandwidth of 1 nm about 40 modes). These values will be used in analyzing additional configurations.

A representation of an SEM image 904 and schematic 906 of the developed sample 908 patterned using diode laser is shown in FIGS. 9B and 9C, respectively. Positive photoresist (SPR 505) was used with a double grating beam-splitter scheme. The silicon sample was spin coated with a layer of BARC (ICON-16) at 3000 rpm. This was followed by spin coating of positive photoresist SPR-505 at 3000 rpm resulting in a thickness of about 500 nm. The soft baking time and temperature for the photoresist is 90 secs and 900° C. respectively. The incident beam power was about 500 mw and the exposure time was 25 s. The exposed sample was post baked at temperature of 1100° C. for 60 s and developed in RD6 developer diluted in water (3:1) for 20 s. The size of the patterned area was approximately 1 cm in diameter.

Figure 10A:
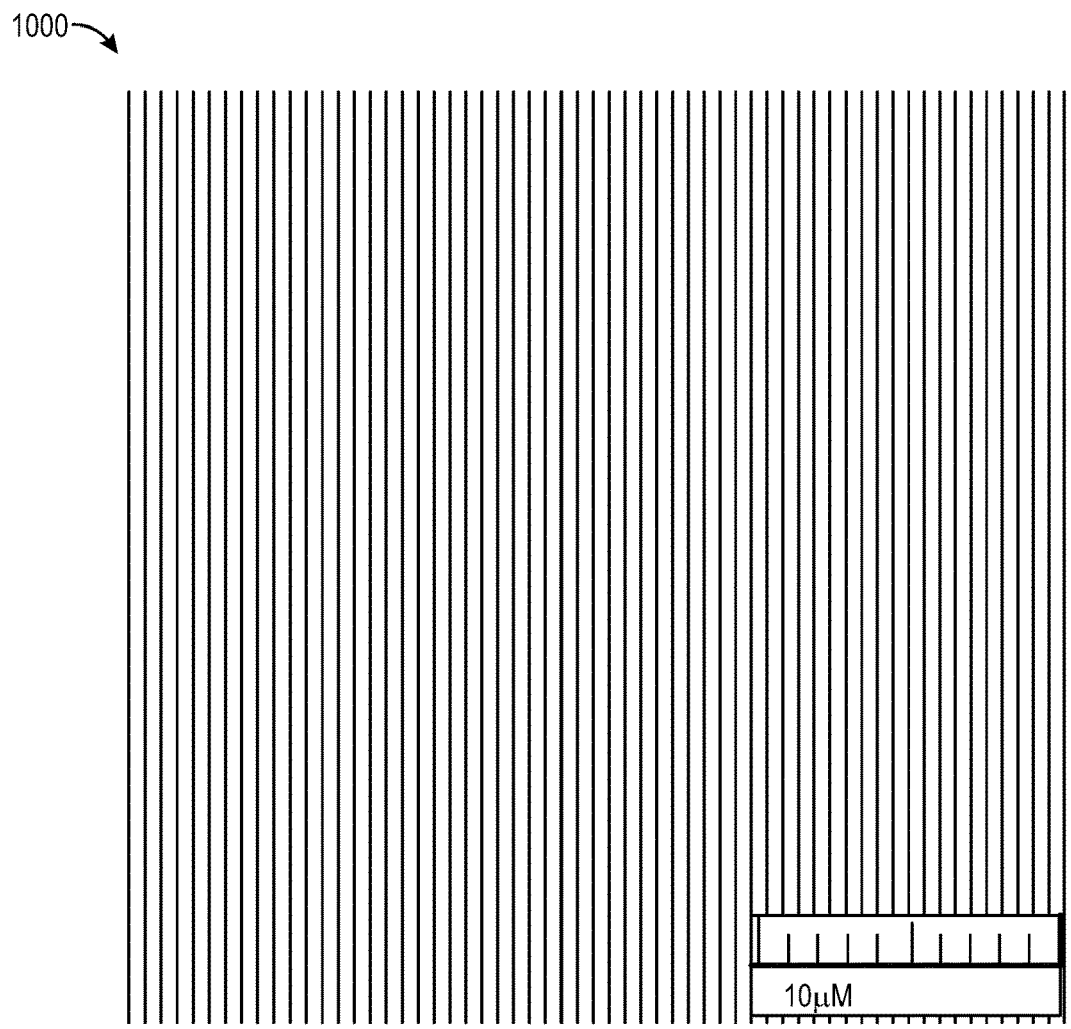
FIGS. 10A and 10B depict a photograph and an SEM image of a developed sample patterned with oblique incidence patterning technique using pulsed YAG laser as source, respectively, in accordance with the present disclosure.
Figure 10B:
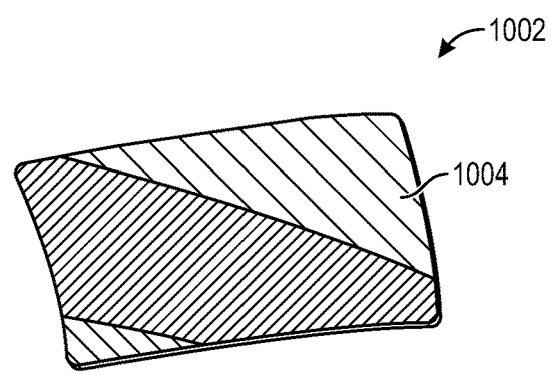

FIGS. 10A and 10B depict a representation of an SEM image 1000 and a schematic 1002 of a developed sample patterned 1004 with oblique incidence patterning technique using pulsed YAG laser as source, respectively, in accordance with the present disclosure. The oblique incidence experiment was also done using a single grating beam-splitter scheme. An i-line negative photoresist NR7-500 was used. A period of patterning was 500 nm. For this experiment we used a Pulsed Yag laser (Coherent infinity 40-100) having emission wavelength of 355 nm. The laser used was single longitudinal mode laser and hence there was no issue of z dependence. Angle of incidence was close to 200. The silicon sample spin coated with ICON-16 first and then photoresist was spin coated at 3000 rpm on to silicon substrate. The soft bake temperature and time were 1500 c and 60 secs respectively. Exposure time and exposure dosage were xxx and yyy respectively. Photo 1002 of the developed sample 1004 and SEM image 1000 of the developed sample is shown in FIGS. 10A and 10B. The size of the sample was approximately ½"×1".

A cost-effective patterning technique has been developed. Diode lasers with multiple longitudinal modes and low coherence lengths can be used as source. The system makes use of oblique incidence and an engineered diffraction phase grating beam-splitter having an optimal diffraction efficiency for patterning. The presence of only two orders makes the technique simple and avoids complexities that is seen in techniques that has more than two orders. The use of spin on glass basically eliminates need for any deposition steps like plasma-enhanced chemical vapor deposition (PECVD) providing a cost-effective, efficient and simple methodology and system, wherein diffraction efficiency can be varied easily by etching to meet the requirements of the patterning.

A grating beam-splitter based large area nanopatterning technique has high relevance especially since it does not require tight phase control and vibration isolation environment as in conventional IL. The technique and system as described herein is scalable and is capable of large area patterning, and can potentially yield systems effective for patterning samples of 4-inch diameter and above using diode laser.

While the present teachings have been illustrated with respect to one or more implementations, alterations and/or modifications may be made to the illustrated examples without departing from the spirit and scope of the appended claims. For example, it may be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It may be appreciated that structural objects and/or processing stages may be added, or existing structural objects and/or processing stages may be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. The terms "couple," "coupled," "connect," "connection," "connected," "in connection with," and "connecting" refer to "in direct connection with" or "in connection with via one or more intermediate elements or members." Finally, the terms "exemplary" or "illustrative" indicate the description is used as an example, rather than implying that it is an ideal. Other embodiments of the present teachings may be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A system for oblique incidence nanopatterning a sample using a grating beam-splitter, the system comprising:
   a grating beam-splitter on a tip-tilt adjustable mount;
   a photoresist coated sample mounted on a tip-tilt-z adjustable mount;
   an alignment system to allow adjustment of the tip-tilt adjustable mounts so that a surface of the grating beam-splitter and a surface of the photoresist coated sample are substantially parallel;
   a single transverse, multi-longitudinal mode laser operating at a wavelength suitable for exposure of the photoresist;
   an optical system to deliver a beam of the single-transverse, multi-longitudinal mode laser at oblique incidence to the grating beam-splitter to expose the photoresist coated sample, wherein a period of the grating and angle of oblique incidence (θ) are adjusted such that there is a transmitted zero-order beam and a corresponding transmitted −1 diffracted order beam that propagates at an angle of ϕ and interferes with the transmitted zero-order incident beam at the surface of the photoresist coated sample for each longitudinal mode; and
   an exposure path opening to control an exposure dose of the laser beam at the sample.

2. The system of claim 1, wherein the wavelength of the laser is 405 nm.

3. The system of claim 1, wherein the oblique incidence is chosen as a Littrow angle for the grating beam-splitter to provide a symmetric angular distribution of the two beams incident on the photoresist.

4. The system of claim 3, wherein the oblique incidence is chosen to produce only a zero-order transmission beam and a transmissive −1 diffractive order beam for each longitudinal mode of the single transverse, multi-longitudinal mode laser.

5. The system of claim 1, wherein the optical system to deliver the laser beam comprises:
  a polarizer; and
  a lens system to expand an optical beam from the laser to cover a desired exposure area.

6. The system of claim 1, wherein the alignment system comprises:
  a laser at a wavelength that does not substantially expose the photoresist;
  an optical system to expand the laser beam to cover an exposure area on the sample and to deliver the laser beam substantially at normal incidence to a surface of the grating beam-splitter; and
  a screen to visualize interference between a portion of the laser beam diffracted from a surface of the grating beam-splitter, and a portion of the laser beam transmitted by the grating beam-splitter, reflected from a surface of the sample and diffracted from the grating beam-splitter.

7. The system of claim 1, wherein the photoresist comprises a positive tone photoresist.

8. The system of claim 1, wherein the photoresist comprises a negative tone photoresist.

9. The system of claim 1, wherein a z-distance of the photoresist coated sample is adjustable in a range of from 0 to about 1 mm.

10. The system of claim 1, wherein a surface of the sample is coated with an anti-reflective coating.

11. The system of claim 1, wherein a line-space ratio and a depth of grooves of the grating are such that the intensities of the zero-order transmitted beam and the −1 diffraction order beam from each longitudinal mode of the single transverse, multi-longitudinal mode laser are substantially equal, to provide a maximum contrast of the interference pattern at the surface of the photoresist coated sample.

12. A system for oblique incidence nanopatterning a sample using two grating beam-splitters to provide increased alignment tolerance, the system comprising:
  a first grating beam-splitter at a first period on a first tip-tilt adjustable mount;
  a second grating beam-splitter at a second period mounted on a second tip-tilt mount;
  a mounting arrangement such that only first-order optical beams diffracted to one side of the first grating beam-splitter are in oblique incidence onto a surface of the second grating beam-splitter;
  a photoresist coated sample mounted on tip-tilt-z adjustable mount behind the second grating beam-splitter;
  an alignment system to allow adjustment of the first and second tip-tilt mounts so that a surface of the first grating beam-splitter, the surface of the second grating beam-splitter and a surface of the photoresist coated sample are substantially parallel;
  a single transverse, multi-longitudinal mode laser at a wavelength suitable for exposure of the photoresist;
  an optical system to deliver a beam from the single-transverse, multi-longitudinal mode laser at oblique incidence to the grating beam-splitter to expose the photoresist coated sample, wherein a period of the grating and angle of oblique incidence (θ) are adjusted such that there is a transmitted zero-order beam and a corresponding transmitted −1 diffracted order beam that propagates at an angle of ϕ and interferes with the transmitted zero-order incident beam at the surface of the photoresist coated sample for each longitudinal mode; and
  an exposure path opening to control an exposure dose of the laser beam at the sample.

13. The system of claim 12, wherein a period of the first grating beam-splitter is substantially half of a period of the second grating beam-splitter.

14. The system of claim 13, wherein a period of the first grating beam-splitter is from half of the wavelength of the laser to 2 microns.

15. The system of claim 12, wherein the wavelength of the laser is substantially 405 nm.

16. The system of claim 12, wherein the optical system to deliver the laser beam comprises:
  a polarizer; and
  a lens system to expand the laser beam from the laser to cover a target exposure area.

17. The system of claim 16, wherein the target exposure area is from 100 nm to 300 nm.

18. The system of claim 12, wherein the alignment system comprises:
  a laser at a wavelength that does not substantially expose the photoresist;
  an optical system to expand the laser beam to cover an exposure area on the sample and to deliver the laser beam substantially at normal incidence to a surface of the second grating beam-splitter; and
  a screen to visualize interference between a portion of the laser beam diffracted from a surface of the second grating beam-splitter, and a portion of the laser beam transmitted by the second grating beam-splitter, reflected from a surface of the sample and diffracted from the second grating beam-splitter.

19. The system of claim 12, wherein the oblique incidence is chosen to produce a zero order transmission beam and no more than one diffractive order transmission beam for each longitudinal mode of the single transverse, multi-longitudinal mode laser.

20. The system of claim 12, wherein a line-space ratio and a depth of grooves of the grating are such that the intensities of the zero-order transmitted beam and the −1 diffraction order beam from each longitudinal mode of the single transverse, multi-longitudinal mode laser are substantially equal, to provide a maximum contrast of the interference pattern at the surface of the photoresist coated sample.

* * * * *